Sept. 19, 1950 J. VACKÁŘ 2,523,240
BALANCED FEEDBACK FOR SYMMETRIC CATHODE FOLLOWERS
Filed Oct. 27, 1948
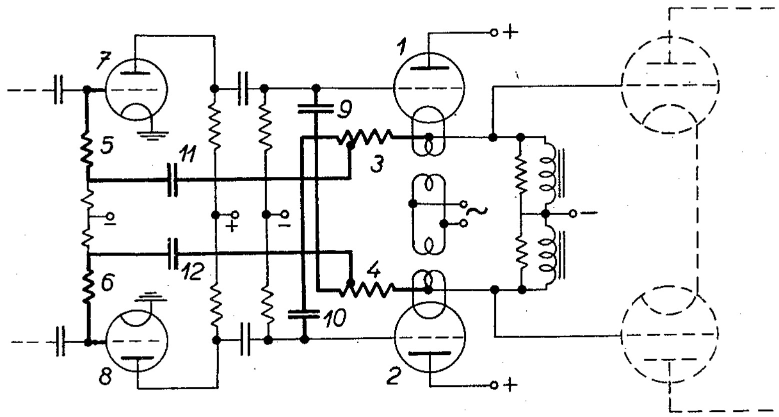
INVENTOR
Jiří Vackář,
BY
Paul H. Smolka Patented Sept. 19, 1950 2,523,240

UNITED STATES PATENT OFFICE 2,523,240

BALANCED FEEDBACK FOR SYMMETRIC CATHODE FOLLOWERS

Jiří Vackář, Prague, Czechoslovakia, assignor of one-half to Tesla, National Corporation, Prague, Czechoslovakia Application October 27, 1948, Serial No. 56,732
In Czechoslovakia November 18, 1947

6 Claims. (Cl. 179—171)

This invention relates to electronic amplifiers and, more particularly, to a novel arrangement of amplifier elements effective to eliminate distortion in low frequency class B high power amplifiers without decreasing the amplification factor.

In symmetric low-frequency class B high-power amplifiers, e. g. in modulation amplifiers for anode modulation of broadcast transmitters, a cathode follower stage is frequently used as the driving stage for the output amplifier because its low internal resistance is advantageous in the case where the valves of the output amplifier are driven into the positive regions of the characteristic and take grid current. In large amplifiers of this type having an output of more than 50 kw., the grid current reaches a value of up to several amperes so that operation is on a non-linear portion of the characteristic curve. The resulting non-linear distortion is directly proportional to the internal resistance of the driving cathode follower. In addition, the cathode of the follower, having a low-frequency A.-C. potential, is heated with A.-C. current from a special transformer of low self-capacity. Due to unavoidable inaccuracies of valve construction, and due to the magnetic field of the heater current, a low-frequency A.-C. component of the heater current frequency is produced across the output, which increases the fundamental amplifier noise. To avoid this, it has been proposed to use a negative feedback arrangement. However, such arrangement, while decreasing noise and distortion, correspondingly decreases the total amplification. Additionally, its application is limited because of the possibility of self-oscillation.

With the foregoing in mind, the present invention is directed to a balanced feedback arrangement of a cathode follower push-pull stage working in series with a class B push-pull output stage. The balanced feedback of the invention may be used to a larger extent than the afore-mentioned negative feedback with the advantage of not decreasing the total amplification. The wiring system according to the invention is characterized in that it has two resistance dividers each respectively connected between the grid of one valve and the cathode of the opposite valve of the cathode follower stage, the feedback voltage from these two resistance dividers being applied to some of the preceding amplifier stages.

An object of the present invention is to provide an improved push-pull class B amplifier in which distortion is eliminated without decreasing the total amplification.

Another object is to provide such an amplifier characterized by a simplified balanced feedback between a cathode follower stage and preceding amplifier stages.

These, and other objects, advantages and novel features of the invention will be apparent from the following description and the accompanying drawing. In the drawing, the single figure is a schematic wiring diagram of an amplifier incorporating the invention.

Referring to the drawing, a cathode follower push-pull stage including electronic valves 1 and 2 is shown as in series with a class B push-pull output stage (shown in broken lines). The cathode follower stage includes resistance dividers 3 and 4, each respectively connecting the grid of one valve to the midpoint of the cathode of the opposite valve. At these midpoints there are low-frequency voltages in phase opposition with each other, the voltage on the cathode also including the distortion and noise components. On these resistance dividers 3 and 4 it is possible to find, near the centers, a point where the two phase opposition voltages just cancel each other out leaving only a component corresponding to, the distortion and noise. The corresponding point, e. g. on divider 3, is then connected, through a suitable resistance 5, with the grid of the valve 7 in the preceding stage of the amplifier and which excites the valve 1 having its cathode connected with the resistance divider 3. Negative feedback is thus produced, which reduces noise and distortion, without affecting the fundamental signal and reducing the amplification. It is, therefore, a case of balanced feedback.

A similar balanced feedback is provided for the second branch of the symmetric cathode follower by connecting the output lead on the resistance divider 4 by means of the resistance 6 with the grid of the valve 8 feeding the valve 2 having its cathode connected to resistance 4.

The described wiring system may be modified in various ways. In practice it is usually necessary to place blocking condensers 9 and 10 in the current path of the resistance divider, in order to block-off the D.-C. biases. Blocking condensers 11 and 12 are included in the feedback paths, and the feedback points on resistances are preferably made adjustable. If desired, the feedback may be impressed on other preceding amplification stages.

While a specific embodiment of the invention has been shown and described in detail to illustrate the application of the invention principles, it should be understood that the invention may be otherwise embodied without departing from such principles.

I claim:

1. In a high power push-pull class B amplifier a cathode follower push-pull amplifier stage working in class A and including a pair of electronic valves; at least one amplifier stage preceding said cathode follower stage and comprising a pair of electronic valves each having its output respectively connected to the input of a valve of said cathode follower stage; a push-pull class B amplifier output stage connected to the output of said cathode follower stage; a pair of resistance voltage dividers each respectively connecting the grid of one valve of the cathode follower stage to the cathode of the opposite valve thereof; and means connecting a tap on each divider to the input of the corresponding valve of a preceding amplifier stage.

2. In a high power push-pull class B amplifier a cathode follower push-pull amplifier stage working in class A and including a pair of electronic valves; at least one amplifier stage preceding said cathode follower stage and comprising a pair of electronic valves each having its output respectively connected to the input of a valve of said cathode follower stage; a push-pull class B amplifier output stage connected to the output of said cathode follower stage; a pair of resistance voltage dividers each respectively connecting the grid of one valve of the cathode follower stage to the midpoint of the cathode of the opposite valve thereof; and means connecting a tap on each divider to the input of the corresponding valve of a preceding amplifier stage.

3. In a high power push-pull class B amplifier a cathode follower push-pull amplifier stage working in class A and including a pair of electronic valves; at least one amplifier stage preceding said cathode follower stage and comprising a pair of electronic valves each having its output respectively connected to the input of a valve of said cathode follower stage; a push-pull class B amplifier output stage connected to the output of said cathode follower stage; a pair of resistance voltage dividers each respectively connecting the grid of one valve of the cathode follower stage to the midpoint of the cathode of the opposite valve thereof; and means connecting a tap on each divider to the grid of the corresponding valve of a preceding amplifier stage.

4. An amplifier as claimed in claim 1 in which said connecting means include resistances.

5. An amplifier as claimed in claim 1 in which said taps are adjustable.

6. An amplifier as claimed in claim 1 in which said dividers are capacity coupled to the grids and directly connected to the cathodes.

JIŘÍ VACKÁŘ.

REFERENCES CITED

The following references are of record in the file of this patent:

UNITED STATES PATENTS

| Number | Name | Date |
|---|---|---|
| 2,007,172 | Black | July 9, 1935 |
| 2,161,844 | Babler | June 13, 1939 |
| 2,270,295 | Harley | Jan. 20, 1942 |